United States Patent [19]
Tanimoto et al.

[11] 4,299,863
[45] Nov. 10, 1981

[54] PRETREATMENT OF AN EPOXY RESIN SUBSTRATE FOR ELECTROLESS COPPER PLATING

[75] Inventors: Fumio Tanimoto; Fumihiro Omori, both of Kyoto, Japan

[73] Assignee: Nippon Denki Kagaku Co., Inc., Kyoto, Japan

[21] Appl. No.: 103,331

[22] Filed: Dec. 13, 1979

Related U.S. Application Data

[63] Continuation of Ser. No. 923,450, Jul. 10, 1978, abandoned.

[30] Foreign Application Priority Data

Jul. 12, 1977 [JP] Japan ................................. 52-84367

[51] Int. Cl.³ ............................................. C23C 3/02
[52] U.S. Cl. ................................... 427/140; 156/632; 156/666; 156/668; 427/98; 427/142; 427/304; 427/305; 427/306; 427/307
[58] Field of Search ............... 427/304, 306, 307, 305, 427/98, 140, 142; 156/632, 666, 668

[56] References Cited

U.S. PATENT DOCUMENTS

| Re. 28,042 | 6/1974 | Rhodenizer et al. | 427/307 |
|---|---|---|---|
| 3,728,177 | 4/1973 | Caule | 156/666 |
| 3,758,332 | 9/1973 | Dinella et al. | 427/307 |
| 3,808,028 | 4/1974 | Lando | 427/307 |
| 3,864,147 | 2/1975 | Grunwald et al. | 427/307 |
| 3,892,635 | 7/1975 | Mallico | 427/98 |
| 4,086,128 | 4/1978 | Sugio et al. | 156/668 |

OTHER PUBLICATIONS

Takagi, Kiyoshi, "Metal Surface Technique", vol. 23, No. 8 pp. 39–45 and vol. 23, No. 9, pp. 40–48 (1972) published by *Metal Surface Technique Society of Japan*.

*Primary Examiner*—John D. Smith
*Attorney, Agent, or Firm*—Morgan, Finnegan, Pine, Foley & Lee

[57] ABSTRACT

The pretreatment of an epoxy resin substrate for electroless copper plating comprises the steps of subjecting the epoxy resin substrate to a treatment with an aqueous solution including a chloride of iron and then subjecting the substrate to a treatment with an aqueous solution of a water soluble peroxide before sensitizing the epoxy resin substrate for electroless copper plating.

11 Claims, No Drawings

PRETREATMENT OF AN EPOXY RESIN SUBSTRATE FOR ELECTROLESS COPPER PLATING

This is a continuation, of application Ser. No. 923,450 filed July 10, 1978 now abandoned.

BACKGROUND OF THE INVENTION

The present invention relates to a method of pretreating an epoxy resin substrate preparatory to electroless copper plating. More particularly, the invention relates to a method which, in performing electroless plating to form a printed circuit on a glass fiber cloth-reinforced epoxy resin laminate, makes it possible to form an electroless copper plating layer which is superior in peeling strength by applying a special pretreatment to said epoxy resin laminate.

As for methods of forming a printed circuit on a glass fiber cloth-reinforced epoxy resin laminate, there are two known methods, the copper cladding method which uses an epoxy resin laminate having a thin layer of copper bonded to the surface thereof in advance, and the so-called additive method which applies direct plating. In the case of the copper cladding method, substrates having sufficient properties to meet high-level requirements are available with comparative ease, but the method has unavoidable disadvantages, such as ununiform film thickness in through holes, the difficulty of forming high precision circuits, an economic loss to chemicals which will be incurred when the unnecessary portions of the copper cladding layer are removed by etching (it being noted that on an average, 70 to 80% of the copper cladding layer on the entire surface area must be dissolved for removal), and the necessity of disposing of waste liquid. In the case of the additive method, as far as applicability to epoxy resins is concerned, there has not yet been developed any chemical surface treatment technique which is as effective as those applied to phenolic resins, ABS resins, polystyrene, and polypropylene. One of the improved technique ever proposed is to roughen the laminate surface by shotblast. In lines 39-45, No. 8, Vol. 23 and lines 40-48, No. 9, Vol. 23 of "METAL SURFACE TECHNIQUES" published by the Metal Surface Technique Society of Japan in 1972, it is stated that the peeling strength can be improved by a treating epoxy resin surface with chromic acid after swelling it with a solvent. However, this method has not been put into practical use, for its industrial merit is low because of required equipment and disposal of waste liquid.

The principal object of the invention is to provide a novel method of pretreating an epoxy resin substrate preparatory to electroless copper plating to form a printed circuit by using an epoxy resin substrate, especially a glass fiber cloth-reinforced epoxy resin substrate, said method being capable of greately improving the peeling strength of electroless copper plating layers.

SUMMARY OF THE INVENTION

According to the invention, before an epoxy resin substrate is sensitized for electroless copper plating, it is treated first with an aqueous solution containing an iron chloride and then with an aqueous solution of a water soluble peroxide. As for the iron chloride, it is possible to use ferrous iron as well as ferric iron.

DETAILED DESCRIPTION OF THE INVENTION

As for the epoxy resin substrate, various conventional known glass fiber cloth-reinforced epoxy resin laminates may be used. Among commercially available glass fiber cloth-reinforced epoxy resin substrates there are included "CS—3225" (trade name) produced by Risho Industry Co., Ltd., "R—1706" (trade name) produced by Matsushita Electric Works, Ltd., "MCLE 61, 1.6 double" (trade name) produced by Hitachi Chemical Co., Ltd., and "CCLE—130, 1.6 double" (trade name) produced by Mitsubishi Gas Chemical Co., Ltd.

As for the aqueous solution containing an iron chloride used in the invention, it is preferable to use a 28-42% aqueous solution of ferric chloride known in the field of etching technique. The aqueous solution may contain other ingredients in addition to ferric chloride, as needed.

It is preferable that the epoxy resin substrate which has been cleansed with an aqueous solution containing ferric chloride according to the invention is treated with a second aqueous solution of a water soluble peroxide immediately after it is thoroughly washed with water while it is wet, with care taken to prevent it from drying upon exposure to the air.

Among the water soluble peroxides used in the invention there are included hydrogen peroxide, sodium peroxyborate and sodium peroxycarbonate. These compounds may be used either singly or in combination of two or more in the form of aqueous solutions.

The concentration of the aqueous solution of such water soluble peroxide or peroxides is preferably within the range of 0.5 to 10%. Concentrations below 0.5% would give unsatisfactory results, while concentrations above 10% would also give unsatisfactory results probably because the oxidation of the substrate surface proceeds excessively.

The aqueous solution of water soluble peroxide or peroxides will give the best result when contacted with the epoxy pesin substrate provided that the treatment temperature is 0° to 40° C., the solution pH is 5 to 10 and the duration of contact is 1 to 20 minutes. Treatment temperatures below 0° C. would require so much time in treatment that they are not practical, while temperatures above 40° C. would give too high the rate of decomposition of the peroxides to control the treatment of the substrate surface, leading to unsatisfactory results. Further pH below 5 would fail to allow the reaction to proceed, giving no notable result, while pH above 10 is not preferable because it gives too high the rate of decomposition of the peroxides.

The adjustment of pH within the above mentioned range may be effected by adding a suitable alkali, for example, sodium hydroxide or sodium silicate, to the aqueous solution of a peroxide or peroxides.

The invention particularly uses a glass fiber cloth-reinforced epoxy resin laminate as a substrate, as described above. Such substrate may have a copper cladding layer on its at least one surface and/or through hole walls or may have exposed surfaces having no such copper cladding layer. What is important in the invention is to cleanse or treat the surface of the epoxy resin substrate with an aqueous solution containing ferric chloride and then treat it with an aqueous solution of a water soluble peroxide or peroxides. The treatmemt with said aqueous solution of ferric chloride will simply exhibit a cleansing effect if the epoxy resin substrate has no cladding layer on its surface, but if a copper-clad epoxy resin substrate is used said treatment will exhibit the effect of completely removing, by etching, the copper layer formed on the surface of the epoxy resin substrate. When printed circuits are formed by the copper cladding method, it sometimes happens that some of the products do not meet the standard requirements and are discarded as waste articles. In such case, if the discarded epoxy resin substrates having erroneous printed circuits thereon are treated with an aqueous solution containing ferric chloride according to the first step of the method of the invention, the copper layers forming the printed circuits are removed to allow the reclamation or reuse of the epoxy resin substrates. In this case, it is also possible to remove solder and other deposites simultaneously.

When discarded copper-cladded laminates with printed circuits are to be treated with an aqueous solution containing ferric chloride so as to reclaim the same, this may be effected preferably by spraying the substrate surfaces with a 28–42% aqueous solution of ferric chloride at 30°–60° C. In the case of an epoxy resin substrate having no such coating layer as copper cladding layer, treatment may be carried out in the same way by spraying it with a 28–42% aqueous solution of ferric chloride at 30°–60° C. or, alternatively, it may be immersed in said solution.

If an epoxy resin substrate which has been treated first with an aqueous solution containing ferric chloride and then with an aqueous solution of a peroxide or peroxides according to the present invention is sensitized with a conventional seeder or sensitizer and then subjected to electroless copper plating, the peeling strength of the resulting copper plating layer will be exceedingly high as compared with the case where this pretreatment is not carried out. The reason why the peeling strength is greatly improved by the pretreatment according to the invention is not fully clear, but it is deemed that it is because the epoxy resin surface is physically and chemically activated by the pretreatment according to the invention. If epoxy resin substrates have sufficient surface activity as in the case of glass fiber cloth-reinforced epoxy resin laminates fresh from the processing line, the intended object could be attained to some extent simply by treatment with an aqueous solution of a water soluble peroxide or peroxides. However, since glass fiber cloth-reinforced epoxy resin substrates which are commercially available do not usually possess sufficient surface activity, it is necessary to treat them with an aqueous solution containing ferric chloride and then with a solution of a peroxide or peroxides according to the invention.

If the surface of the epoxy resin substrate which has been pretreated according to the invention is dried, the effect of the pretreatment thus applied would be reduced and the properties of the printed circuits obtained through subsequent electroless plating would be because ununiform. Accordingly, after the substrate is treated with the aqueous solution of a water soluble peroxide or peroxides and washed with water, it must be sensitized as soon as possible lest it should dry, and then it is passed to the process for electroless copper plating via the process for treatment with an accelerator. As for the processes for sensitization, for treatment with an accelerator, and for electroless plating, any desired conventional known methods may be utilized. The sensitizer may, for example, be of the $PdCl_2$—$SnCl_2$ type and the accelerator may, for example, ammonium bifluoride or of the sulfate type. As for the electroless copper plating bath, it is possible to use a copper sulfate plating bath. In order to obtain a desired plating layer thickness, the electroless copper plating may be followed by washing with sulfuric acid and then by additional electrolytic copper plating, whereby it is possible to form a printed circuit having a desired plating layer thickness. The thickness of the plating layer on the end product is, for example, 30–50μ.

PREFERRED EMBODIMENTS OF THE INVENTION

Examples of the invention and control examples are shown below.

EXAMPLES 1—1 TO 1-5

Copper-clad epoxy glass print substrates ("CS—3225", a trade name article produced by Risho Industry Co., Ltd., "CS—3225", a trade name article produced by Risho Industry Co., Ltd., "R—1706", a trade name article produced by Matsushita Electric Works, Ltd., "MCLE 61-1.6 double", a trade name article produced by Hitachi Chemical Co., Ltd., and "CCLE—130-1.6 double", a trade name article produced by Mitsubishi Gas Chemical Co., Ltd., said articles being used respectively as Examples 1—1 to 1-5 of the invention) were used to provide offgrade printed circuit boards, the printed circuits being formed by electroless copper plating, electro copper plating and electro solder plating. A 38% aqueous solution of ferric chloride heated to 50° C. was sprayed over said offgrade articles by an etching machine to completely dissolve the solder and copper on the circuit boards for removal. These substrates were then treated with a solution containing 30 g/l of hydrogen peroxide adjusted to pH 5.2, at 10°–15° C. for 8–10 minutes, and washed with water. Under the following conditions, they were subjected successively to treatment with hydrochloric acid, treatment with sensitizer, treatment with accelerator, electroless copper plating, treatment with sulfuric acid, and electro copper plating. The products thus obtained were used as test pieces.

Treatment with hydrochloric acid

The substrates treated with hydrogen peroxide were washed with water and without allowing them to dry they were immediately immersed in a bath containing 300 ml/l of hydrochloric acid, at room temperature (5°–35° C.) for 1-5 minutes.

Treatment with sensitizer

The substrates were immersed in a $PdCl_2$—$SnCl_2$ type sensitizer bath, at 5°–40° C. for 1–10 minutes, said bath containing 620 ml pure water, 320 ml hydrochloric acid, and 60 ml of Sensitizer HS—101B (produced by Hitachi Chemical Co., Ltd.), totaling to 1 l.

Treatment with accelerator

The substrates were treated with 50–150 g/l of OPO-500 (produced by Okuno Pharmaceutical Co., Ltd.) at 5°–40° C. for 1-5 minutes.

Electroless copper plating

The substrates were immersed in an electroless copper plating bath at 15°–30° C. for 10-30 minutes to have copper deposited thereon, said bath containing 660 ml pure water, 170 ml of Solution 200A (produced by Okuno Pharmaceutical Co., Ltd.), and 170 ml of Solution 200B (produced by Okuno Pharmaceutical Co., Ltd.), totaling to 1 l.

Treatment with sulfric acid

The substrates which had been subjected to said electroless copper plating were immersed in a bath containing 100 ml/l sulfuric acid to 5°-35° C. for 0.5-3 minutes.

Electro copper plating

A copper pyrophosphate plating bath was used which contained 26-40 g/l of copper, $(P_2O_7)/(Cu)=$ 6-8, 3-6 cc/l of ammonia, 1-5 cc/l of Additive $CP_2$ (produced by Murata Chemical Co., Ltd.), temperature being 50°-60° C., pH being 8.3-8.9, and the plating was conducted at a current density of 0.5-4.0 for 1-1.5 hours, whereby 30-40$\mu$ thick copper layers were deposited on the substrates, which were then used as test pieces.

EXAMPLES 2-1 TO 2-5

Offgrade printed circuit boards prepared by using copper clad epoxy glass print substrates (used respectively as Examples 2-1 to 2-5) which were the same as those used in Examples 1—1 to 1-5 were sprayed with a 38% aqueous solution of ferric chloride heated to 50° C. by an etching machine to completely dissolve the solder and copper on the circuits boards for removal. After the substrates were washed with water, they were immersed in a bath containing 50 g/l hydrogen peroxide adjusted to pH 10.0 with sodium silicate at 5°-80° C. for 5-7 minutes and were washed with water, whereupon they were subjected successively to treatment with hydrochloric acid, treatment with a sensitizer, treatment with an accelerator, electroless copper plating, treatment with sulfuric acid and electro copper plating, which were the same as those in Example 1. The articles thus obtained were used as test pieces.

EXAMPLES 3-1 TO 3-5

Offgrade printed circuit boards prepared by using copper clad epoxy glass print substrates (used, respectively, as Examples 3-1 to 3-5) which were the same as those used in Examples 1—1 to 1-5) were sprayed with a 38% aqueous solution of ferric chloride heated to 50° C. by an etching machine to completely dissolve the solder and copper on the circuit boards for removal. After the substrates were washed with water, they were immersed in an aqueous solution containing 100 g/l hydrogen peroxide adjusted to pH 9.5 with sodium silicate and sodium hydroxide, at 27°-30° C. for 30 minutes and were washed with water, whereupon they were subjected successively to treatment with hydrochloric acid, treatment with a sensitizer, treatment with an accelerator, electroless copper plating, treatment with sulfuric acid and electro copper plating, which were the same as those in Example 1. The articles thus obtained were used as test pieces.

EXAMPLES 4-1 TO 4-5

Offgrade printed circuits boards prepared by using copper clad epoxy glass print substrates (used, respectively, as Examples 4-1 to 4-5) which were the same as those used in Examples 1—1 to 1-5 were sprayed with a 38% aqueous solution of ferric chloride heated to 50° C. by an etching machine to completely dissolve the solder and copper on the circuit boards for removal. After the substrates were washed with water, they were immersed in an aqueous solution containing 50 g/l sodium peroxyborate adjusted to pH 10.5 at 50° C. for 10 minutes, whereupon they were subjected successively to treatment with hydrochloric acid, treatment with sensitizer, treatment with accelerator, electroless copper plating, treatment with sulfuric acid and electro copper plating, as in the case of Example 1. The articles thus obtained were used as test pieces.

EXAMPLES 5-1 TO 5—5

Copper clad epoxy glass print substrates (used, respectively, as Examples 5-1 to 5—5) which were the same as those in Examples 1—1 to 1-5 were sprayed with a 38% aqueous solution of ferric chloride heated to 50° C. by an etching machine to completely dissolve the copper cladding for removal and were washed with water, whereupon they were immersed in the aqueous solution containing sodium peroxide, 20 g/l; sodium silicate, 16 g/l; and boric acid, 24 g/l and adjusted to pH 10.5 at 38°-40° C. for 15 minutes.

After they were washed with water, they were subjected successively to treatment with hydrochloric acid, treatment with sensitizer, treatment with accelerator, electroless copper plating, treatment with sulfuric acid and electro copper plating, as in the case of Example 1. The articles thus obtained were used as test pieces.

EXAMPLE 6

An epoxy glass print substrate without copper cladding (prepared by impregnating a 0.18 mm thick plain woven glass fiber cloth, Code No. WE-18G-104BZ 2, produced by Nitto Boseki Co., Ltd., with a varnish, Product No. SCL-1, produced by Maruzen Oil Company Ltd., allowing it to dry at room temperature for 3 hours, pre-curing the dried preimpregnated cloth in an oven at 145° C. for 12 minutes, laminating 9 sheets of the thus obtained B-state pre-impregnated cloth, and pressing the laminate at 170° C. under a pressure of 25 kg/cm$^2$ for 1 hour, with Teflon release sheets applied to the opposite surfaces of said laminate) was sprayed with a 38% aqueous solution of ferric chloride heated to 50° C., for 3 minutes by an etching machine. After being washed with water, it was immersed in an aqueous solution containing 50 g/l hydrogen peroxide adjusted to pH 10.0 with sodium silicate, at 5°-80° C. for 5-7 minutes, as in the case of Example 1, washed with water, and subjected successively to treatment wit hydrochloric acid, treatment with sensitizer, treatment with accelerator, electroless copper plating, treatment with sulfuric acid and electro copper plating. The article thus obtained was used as a test piece.

CONTROL EXAMPLES 1—1 AND 1-2

Copper clad epoxy glass print substrates (CS—3225, a trade name article produced by Risho Industry Co., Ltd., and R—1706, a trade name article produced by Matsushita Electric Works, Ltd., used respectively as Control Examples 1—1 and 1-2) were used to provide offgrade printed circuit boards, which were then sprayed with a 38% aqueous solution of ferric chloride heated to 50° C. by an etching machine to completely dissolve the solder and copper on the circuit boards for removal and then they were subjected successively to treatment with hydrochloric acid, treatment with sensitizer, treatment with accelerator, electroless copper plating, treatment with sulfuric acid and electro copper plating, as in the case of Example 1. The articles thus obtained were used as test pieces.

CONTROL EXAMPLES 2-1 AND 2—2

Copper clad epoxy glass print substrates (CS-3225, a trade name article produced by Risho Industry Co., Ltd., and R-1706, a trade name article produced by Matsushita Electric Works, Ltd., used respectively as Control Examples 2-1 and 2—2) were used to provide offgrade printed circuit boards, which were then sprayed with a 38% aqueous solution of ferric chloride heated to 50° C. by an etching machine to completely dissolve the solder and copper on the circuit boards for removal. After the substrates were washed with water, they were sandblasted. After being washed with water, they were subjected successively to treatment with hydrochloric acid, treatment with sensitizer, treatment with accelerator, electroless copper plating, treatment with sulfuric acid and electro copper plating, which were the same as those in Example 1. The articles thus obtained were used as test pieces.

The test pieces obtained in the above examples of the invention and control examples were tested for peeling strength in accordance with JIS C6981. The test results are shown in Table 1.

TABLE 1

|  | Peeling Strength (JIS C6981) |
|---|---|
| Example 1 - 1 | 1.44 |
| Example 1 - 2 | 1.46 |
| Example 1 - 3 | 1.86 |
| Example 1 - 4 | 1.69 |
| Example 1 - 5 | 1.44 |
| Example 2 - 1 | 1.45 |
| Example 2 - 2 | 1.46 |
| Example 2 - 3 | 1.90 |
| Example 2 - 4 | 1.65 |
| Example 2 - 5 | 1.52 |
| Example 3 - 1 | 1.45 |
| Example 3 - 2 | 1.42 |
| Example 3 - 3 | 1.76 |
| Example 3 - 4 | 1.65 |
| Example 3 - 5 | 1.43 |
| Example 4 - 1 | 1.42 |
| Example 4 - 2 | 1.43 |
| Example 4 - 3 | 1.51 |
| Example 4 - 4 | 1.48 |
| Example 4 - 5 | 1.43 |
| Example 5 - 1 | 1.42 |
| Example 5 - 2 | 1.43 |
| Example 5 - 3 | 1.57 |
| Example 5 - 4 | 1.55 |
| Example 5 - 5 | 1.45 |
| Example 6 | 1.47 |
| Control 1 - 1 | 0.85 |
| Control 1 - 2 | 0.89 |
| Control 2 - 1 | 0.56 |
| Control 2 - 2 | 0.86 |

What we claim is:

1. A method for the pretreatment of an epoxy substrate for electroless copper plating comprising the steps of subjecting the epoxy resin substrate to a treatment with an aqueous solution including ferric chloride and then immediately subjecting the substrate to a treatment with an aqueous solution of hydrogen peroxide without drying before sensitizing the epoxy resin substrate for electroless copper plating, said aqueous solution of hydrogen peroxide having a pH value between about 5 and about 10.

2. A method for the pretreatment of an epoxy resin substrate for electroless metal plating as defined in claim 1, in which said epoxy resin substrate is a glass fiber cloth-reinforced epoxy resin laminate.

3. A method for the pretreatment of an epoxy resin substrate of electroless metal plating as defined in claim 1, in which the treatment of said substrate with an aqueous solution of hydrogen peroxide is conducted with use of a 5 to 10% aqueous solution of hydrogen peroxide, at 0° to 40° C. and for 1 to 20 minutes.

4. A reproduction process of an epoxy resin substrate for electroless metal plating comprising the steps of subjecting an epoxy resin substrate having a copper cladding or plating layer at least partially covering at least one of the surfaces thereof to a treatment with an aqueous solution including ferric chloride to remove said copper cladding or plating layer and then immediately subjecting said epoxy resin substrate to a treatment with an aqueous solution of hydrogen peroxide without drying, said aqueous solution of hydrogen peroxide having a pH value between about 5 and about 10.

5. A reproduction process of an epoxy resin substrate for electroless metal plating as defined in claim 4, in which said epoxy resin substrate is a glass fiber cloth-reinforced epoxy resin laminate.

6. A reproduction process of an epoxy resin substrate for electroless metal plating as defined in claim 4, in which the treatment of said substrate with an aqueous solution of hydrogen peroxide is conducted with use of a 5 to 10% aqueous solution of hydrogen peroxide, at 0° to 40° C. and for 1 to 20 minutes.

7. A method for sensitizing an epoxy resin substrate for electroless copper plating comprising the steps of subjecting an epoxy resin substrate to a treatment with an aqueous solution including ferric chloride, subjecting said substrate to a treatment with an aqueous solution of hydrogen peroxide and immediately after then, without drying, subjecting said substrate to a sensitizer treatment, said aqueous solution of hydrogen peroxide having a pH value between about 5 and about 10.

8. A method for the pretreatment of an epoxy resin substrate for electroless copper plating comprising the steps of subjecting the epoxy resin substrate to a treatment with an aqueous solution including a chloride of iron and then subjecting the substrate to a treatment with an aqueous solution of a water soluble peroxide before sensitizing the epoxy resin substrate for electroless copper plating, said aqueous solution of peroxide having a pH between about 5 and about 10.

9. A method as defined in claim 8 wherein said aqueous solution is adjusted to said pH with sodium silicate and/or sodium hydroxide.

10. A method for the pretreatment of an epoxy resin substrate for electroless copper plating consisting essentially of the steps of subjecting the epoxy resin substrate to a treatment with an aqueous solution including ferric chloride and then subjecting the substrate to a treatment with an aqueous solution of hydrogen peroxide before sensitizing the epoxy resin substrate for electroless copper plating, said aqueous solution of hydrogen peroxide having a pH value between about 5 and about 10.

11. A reproduction process of an epoxy resin substrate for electroless metal plating comprising the steps of subjecting an epoxy resin substrate having a copper cladding or plating layer at least partially covering at least one of the surfaces thereof to a treatment with an aqueous solution including ferric chloride to remove said copper cladding or plating layer and then subjecting said epoxy resin substrate to a treatment with an aqueous solution of hydrogen peroxide, said aqueous solution of hydrogen peroxide having a pH value between about 5 and about 10.

* * * * *